(12) United States Patent
Inaba

(10) Patent No.: US 8,569,867 B2
(45) Date of Patent: Oct. 29, 2013

(54) SEMICONDUCTOR DEVICE

(75) Inventor: Satoshi Inaba, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/364,716

(22) Filed: Feb. 2, 2012

(65) Prior Publication Data

US 2012/0319164 A1 Dec. 20, 2012

(30) Foreign Application Priority Data

Jun. 15, 2011 (JP) ................................. 2011-133376

(51) Int. Cl.
*H01L 27/082* (2006.01)
*H01L 29/08* (2006.01)

(52) U.S. Cl.
USPC ........... 257/574; 257/111; 257/175; 257/511; 257/157; 257/575; 257/E27.053; 257/E29.181

(58) Field of Classification Search
USPC ................. 257/111, 157, 175, 511, 574, 575, 257/E27.053, E29.181
See application file for complete search history.

(56) References Cited

U.S. PATENT DOCUMENTS

2010/0207163 A1* 8/2010 Yabu et al. .................... 257/173

FOREIGN PATENT DOCUMENTS

| JP | 2-263473 | 10/1990 |
|---|---|---|
| JP | 2006-310458 | 11/2006 |
| JP | 2008-172174 | 7/2008 |

OTHER PUBLICATIONS

Harald Gossner, et al., "Unique ESD Failure Mechanism in a MuGFET Technology", IEDM Tech. Dig., 2006, 4 pages.
Christian C. Russ, et al., "ESD Evaluation of the Emerging MuGFET Technology", IEEE Transactions on Device and Materials Reliability, vol. 7, No. 1, Mar. 2007, pp. 152-161.
Digh Hisamoto, et al., "A Folded-channel MOSFET for Deep-sub-tenth Micron Era", IEDM tech. Dig., 1998, 2 pages.
Xuejue Huang, et al., "Sub 50-nm FinFET: PMOS", IEDM Tech. Dig., 1999, 2 pages.
K. Okano, et al., "Process Integration Technology and Device Characteristics of CMOS FinFET on Bulk Silicon Substrate with sub-10 nm Fin Width and 20 nm Gate Length", IEDM Tech. Dig., 2005, 2 pages.
Yang-Kyu Choi, et al., "Sub-20nm CMOS FinFET Technologies", IEDM Tech. Dig., 2001, 2 pages.

* cited by examiner

*Primary Examiner* — Victor A Mandala
(74) *Attorney, Agent, or Firm* — Oblon, Spivak, McClelland, Maier & Neustadt, L.L.P.

(57) ABSTRACT

According to one embodiment, a semiconductor device that has a rectification element includes a semiconductor substrate, a first well region of a first conductivity type formed on the semiconductor substrate, a second well region of a second conductivity type formed on the semiconductor substrate, and a plurality of fins arranged over the first well region and the second well region at a first pitch in the same direction. In the semiconductor device, the rectification element includes a cathode region, an anode region, a well contact region, and a trigger region that are configured using fins. These regions are connected to each wiring portion to form a PNP-type bipolar transistor and an NPN-type bipolar transistor.

20 Claims, 9 Drawing Sheets

SEMICONDUCTOR DEVICE

CROSS-REFERENCE TO RELATED APPLICATION

This application is based upon and claims the benefit of priority from prior Japanese Patent Application No. 2011-133376 filed on Jun. 15, 2011 in Japan, the entire contents of which are incorporated herein by reference.

FIELD

The embodiments of the present invention relate to a semiconductor device.

BACKGROUND

In recent years, concerning LSIs that are formed on silicon substrates, high performance of the LSIs is achieved by miniaturizing the size of a device used in the LSI, that is, decreasing the gate length based on a so-called scaling rule or decreasing the thickness of a gate insulating film. Currently, a fully-depleted channel MOSFET (FD-type channel MOSFET) is studied and developed to improve cut-off characteristics in a short channel region where the gate length Lg is 30 nm or less.

As one kind of the semiconductor devices, the following various metal-insulator-semiconductor (MIS)-type semiconductor devices having a three-dimensional structure are suggested. Specifically, a double-gate fully-depleted channel MOSFET (FinFET) is suggested in which a protrusion-shaped region is formed by minutely cutting a silicon-on-insulator (SOI) substrate or a bulk silicon substrate in a stripe shape (the protrusion-shaped region is referred to as "fin"), a gate electrode is formed to cross over the protrusion-shaped region three-dimensionally, and the top surface and the sides of the cut protrusion-shaped region are used as a channel.

In order to operate the FinFET as a fully-depleted channel, the width of the fin needs to be decreased to be smaller than the gate length Lg. Therefore, in the FinFET, plural fins that have a narrow width are arranged.

DETAILED DESCRIPTION

In an embodiment, a semiconductor device having a rectification element includes a semiconductor substrate, a first well region of a first conductivity type formed on the semiconductor substrate, a second well region of a second conductivity type formed on the semiconductor substrate, and plural fins arranged over the first well region and the second well region at a first pitch in the same direction. In the semiconductor device, the first well region and the second well region are arranged to be in contact with each other in a direction along a short side of the fin to form a well region boundary parallel to a long side of the fin. A first pair of the fins are positioned so as to interpose the well region boundary therebetween, one fin of the first pair is a cathode region with a second conductivity type impurity diffusion layer region positioned in the first well region, and another fin of the first pair is an anode region with a first conductivity type impurity diffusion layer region positioned in the second well region. A second pair of the fins is positioned so as to interpose the first pair therebetween, one fin of the second pair is a well contact region with a first conductivity type impurity diffusion layer region positioned in the first well region, and another fin of the second pair is a trigger region with a second conductivity type impurity diffusion layer region positioned in the second well region. The rectification element includes the cathode region, the anode region, the well contact region, and the trigger region, and each of the cathode region, the anode region, the well contact region, and the trigger region is connected to each wiring portion to form a PNP-type bipolar transistor and an NPN-type bipolar transistor.

Hereinafter, embodiments will be described with reference to the drawings. However, the present invention is not limited to the embodiments. Like reference numbers refer to like elements in all of the drawings and the redundant description will not be repeated. In addition, the drawings are schematic views to promote description of the present invention and the understanding thereof, and the shapes, dimensions, and ratios thereof may be different from those of real devices. However, a design can be appropriately changed in consideration of the following description and a known technology.

Semiconductor devices according to the following first to third embodiments are described as, for example, a FinFET that has an ESD protection element (silicon rectification element) of a silicon controlled rectifier (SCR) (or thyristor) type as an ESD protection element.

Figure 1:
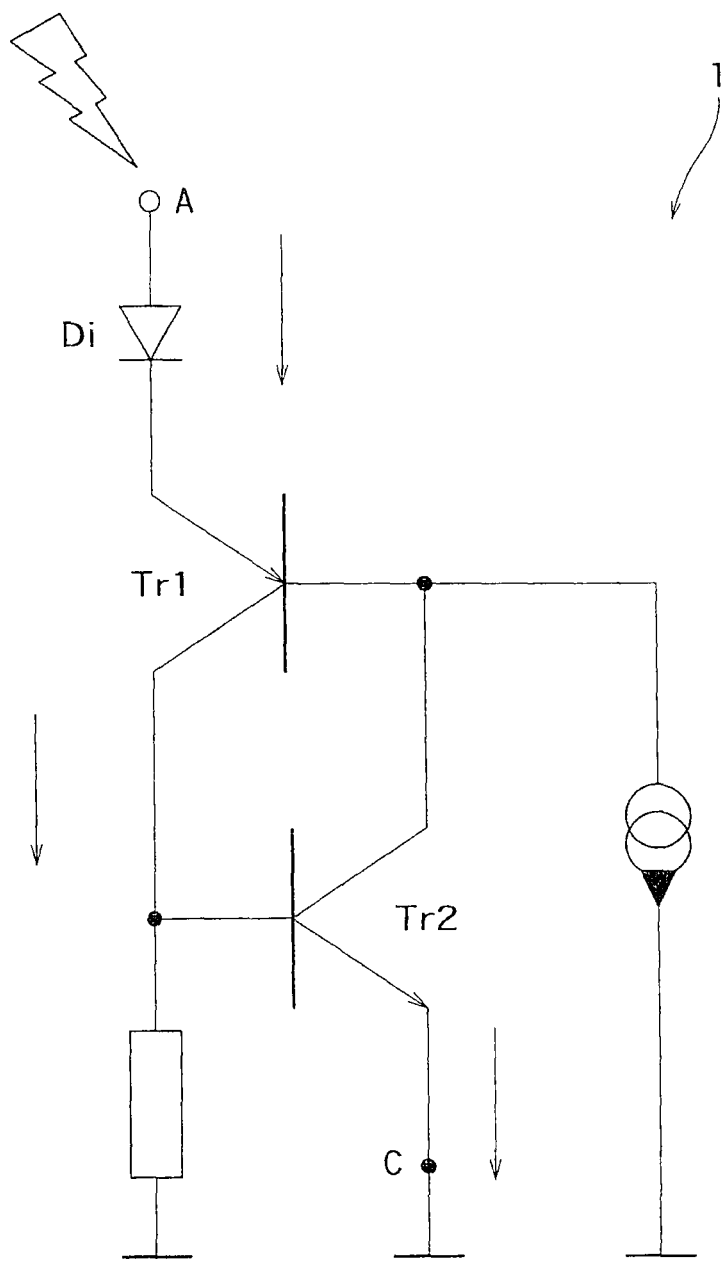
FIG. 1 is a circuit diagram illustrating an SCR-type Electrostatic Discharge (ESD) protection element.
Figure 2:
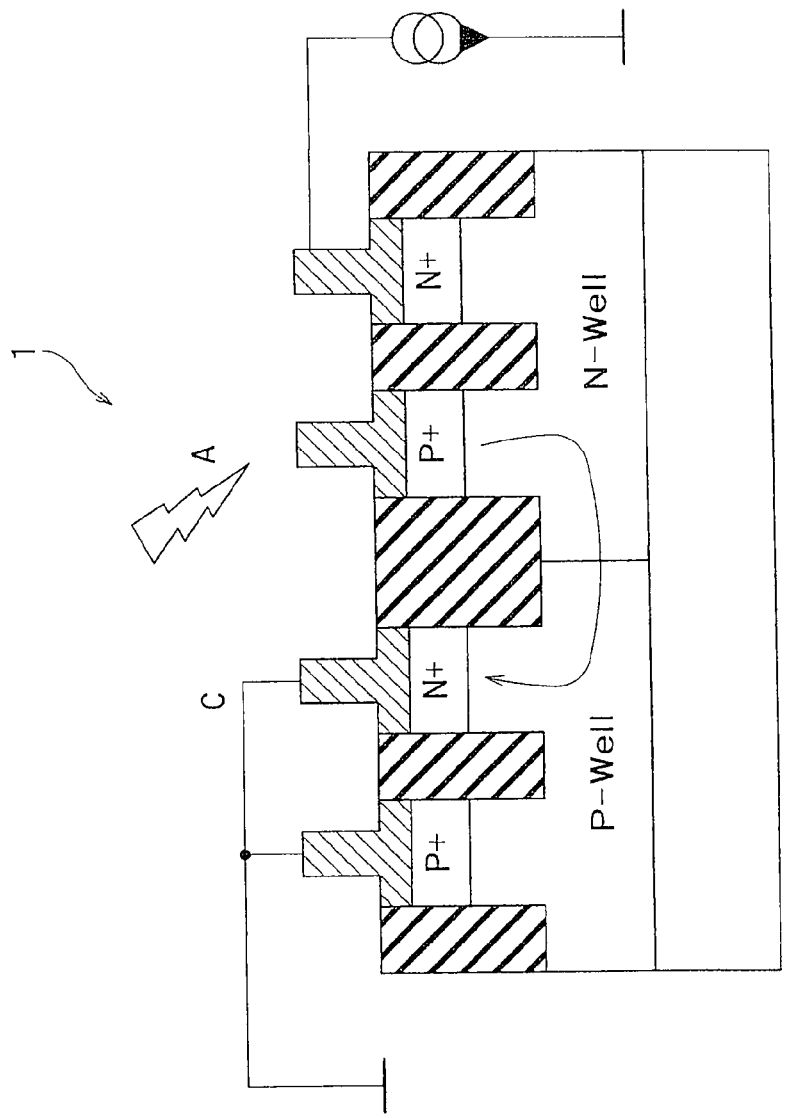
FIG. 2 is a cross-sectional view illustrating the SCR-type ESD protection element.

FIG. 1 illustrates an example of a circuit diagram of a circuit of an SCR-type ESD protection element 1. FIG. 2 illustrates a cross-sectional view of the SCR-type ESD protection element 1 illustrated in FIG. 1.

As illustrated in FIG. 1, the SCR-type ESD protection element 1 has a diode Di connected in series to an anode terminal A, a pnp bipolar transistor Tr1 of which a collector is connected to the side of the anode terminal A, and an npn bipolar transistor Tr2 of which an emitter is connected to a cathode terminal C. The SCR-type ESD protection element 1 is disposed between an external connection terminal (not illustrated in the drawings) connected to the outside of the semiconductor device and an internal circuit (not illustrated in the drawings) of the semiconductor device. When a surge of a high voltage by static electricity is input to the external connection terminal, the pnp bipolar transistor Tr1 and the npn bipolar transistor Tr2 are turned on such that the internal circuit is not destroyed by the surge. As illustrated by arrows of FIG. 1, the current flows from the anode terminal A to an emitter of the pnp bipolar transistor Tr1, the current flows from a base of the npn bipolar transistor Tr2 to the emitter thereof, and the current is discharged from the cathode terminal C to a ground. Therefore, in a cross-section of the SCR-type ESD protection element 1 illustrated in FIG. 2, the current flows from the anode A to the cathode C, as illustrated by an arrow.

First Embodiment

Figure 3:
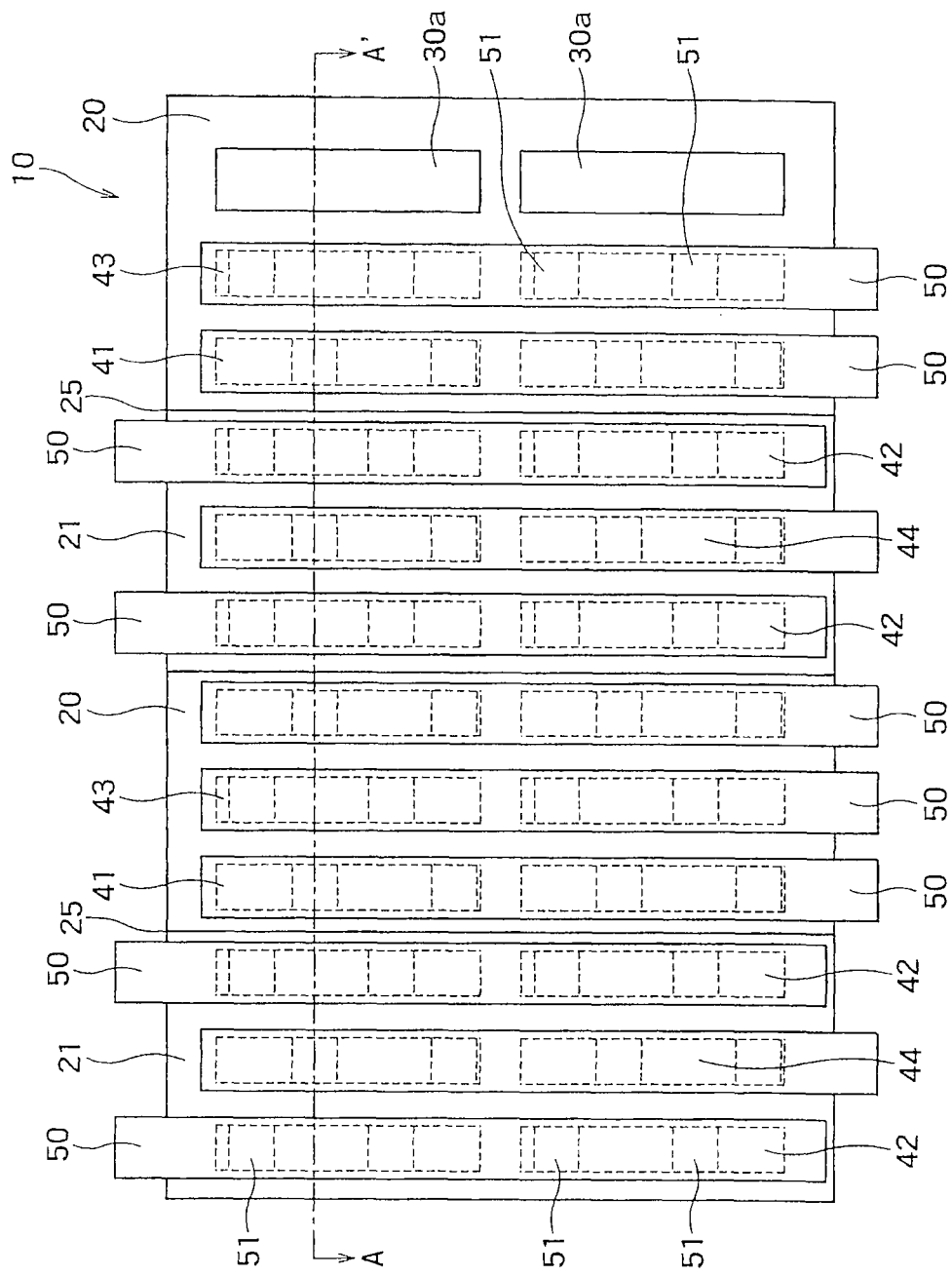
FIG. 3 is a plan view of a semiconductor device according to a first embodiment.
Figure 4:
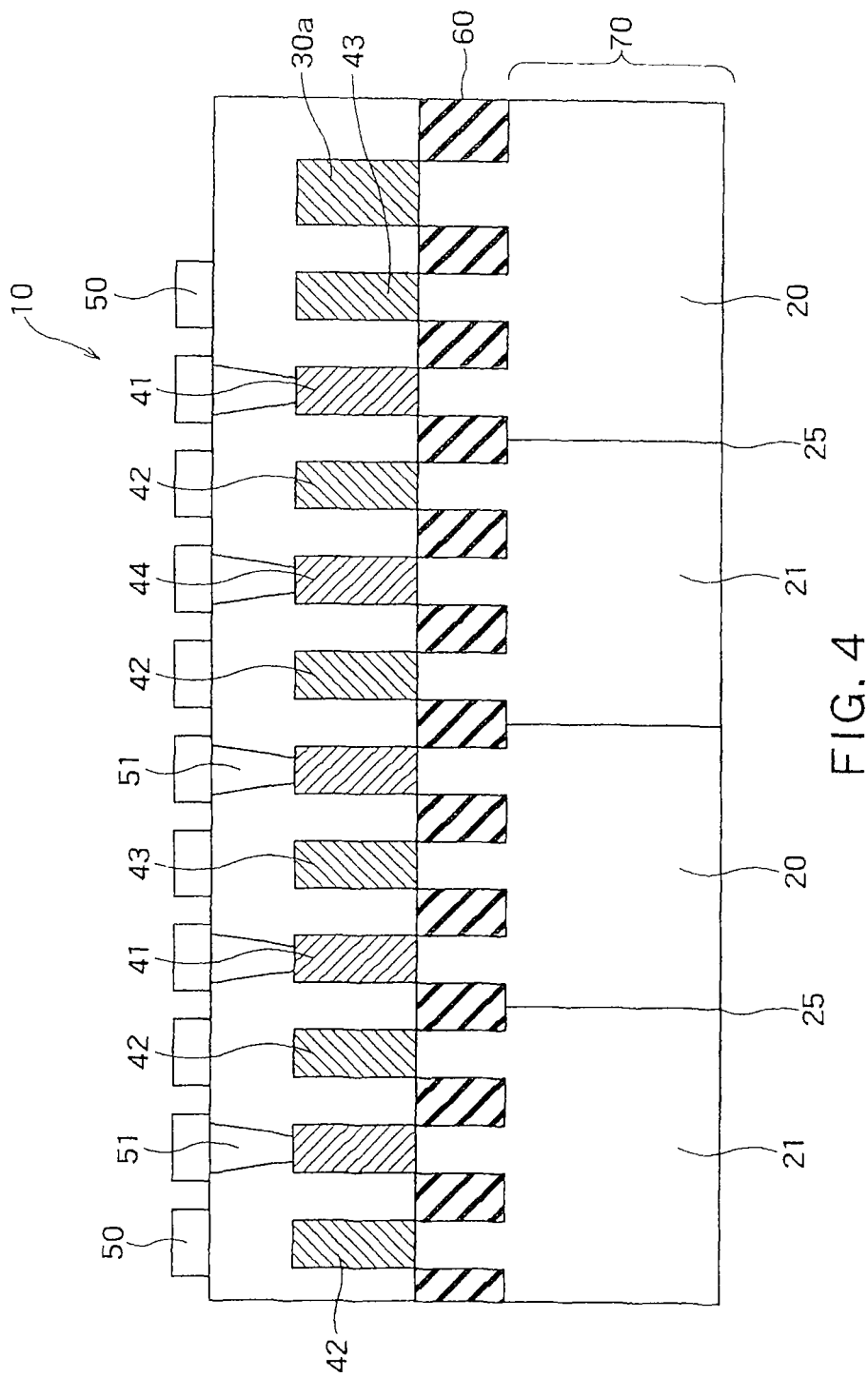
FIG. 4 is a cross-sectional view of the semiconductor device according to the first embodiment.

FIG. 3 illustrates a plan view of the FinFET according to this embodiment and FIG. 4 illustrates a cross-sectional view taken along the line A-A' of FIG. 3. In FIG. 3, each fin and each contact region that exist below wiring lines are illustrated by a dotted line.

In this embodiment, the SCR-type ESD protection element 1 is formed using the plural fins formed in the FinFET. The SCR-type ESD protection element 1 is formed without using an outermost circumferential fin 30a disposed on the outermost circumference, in a fin arrangement region 10 where the plural fins having the same width are arranged at the same pitch. On the outermost circumference of the fin arrangement region 10 where the outermost circumferential fin 30a is disposed, a P-type well region 20 is formed.

As illustrated in FIGS. 3 and 4, the SCR-type ESD protection element 1 according to this embodiment has a P-type well region 20 that is positioned at the outermost circumference of a semiconductor substrate 70 and an N-type well region 21 that is positioned to be adjacent to the P-type well region 20. In detail, the N-type well region 21 is adjacent to the P-type well region 20 in a direction along the short side of the fin. Each of the well regions 20 and 21 has plural fins that are arranged in a stripe shape at the same pitch in the same direction over the entire well region. An entire region where the plural fins are arranged is the fin arrangement region 10.

A well region boundary 25 exists at a boundary of the P-type well region 20 and the N-type well region 21 and is parallel to the long side of the fin. A cathode region 41 that is a fin having an N-type impurity diffusion layer region is positioned in the P-type well region 20, and an anode region 42 that is a fin having a P-type impurity diffusion layer region is positioned in the N-type well region 21, such that the well region boundary 25 is interposed between the cathode region 41 and the anode region 42. A well contact region 43 that is a fin having a P-type impurity diffusion layer region is positioned in the P-type well region 20, and a trigger region 44 that is a fin having an N-type impurity diffusion layer region is positioned in the N-type well region 21, such that the cathode region 41 and the anode region 42 are interposed between the well contact region 43 and the trigger region 44. The trigger region 44 is adjacent to the anode region 42 that is the fin having the P-type impurity diffusion layer region. That is, the trigger region 44 is interposed between the two anode regions 42.

In other words, the SCR-type ESD protection element 1 according to this embodiment has the P-type well region 20 and the N-type well region 21 that is adjacent to the P-type well region with the well boundary region 25 interposed therebetween, sequentially from the outermost circumference of the semiconductor substrate 70. In the P-type well region 20, the cathode region 41 and the well contact region 43 are disposed sequentially from the side of the well region boundary 25. In the N-type well region 21, the anode region 42, the trigger region 44, and the anode region 42 are disposed sequentially from the side of the well region boundary 25.

The cathode region 41, the anode region 42, the well contact region 43, and the trigger region 44 are connected to wiring lines 50 through the contact regions 51. The plural wiring lines 50 are preferably arranged at the same pitch. In this way, the wiring lines 50 can be formed with high dimension precision.

As illustrated in FIGS. 3 and 4, the outermost circumferential fin 30a that exists at the outermost circumference of the P-type well region 20, that is, the outermost circumferential fin 30a that exists at the outermost circumference of the fin arrangement region 10 is formed to have the P-type impurity diffusion layer region, the contact region 51 that corresponds to the outermost circumferential fin 30a is not formed, and the outermost circumferential fin 30a is set to an electrically floating state. That is, the outermost circumferential fin 30a that is positioned to be closer to the outer circumference than the well contact region 43 is not used as a portion forming the SCR-type ESD protection element 1. Since the outermost circumferential fin 30a is positioned at the outermost circumference of the fin arrangement region 10, for example, the fin width may be different due to the lithography variation and etching variation at the outermost pattern edge, that is, the outermost circumferential fin 30a may have a shape different from a shape of the fin of a center portion of the fin arrangement region 10. However, since the outermost circumferential fin 30a is not used as the portion forming the SCR-type ESD protection element 1, the deterioration of an electrical characteristic or the variation of a characteristic of the SCR-type ESD protection element 1 due to the different shape of the outermost circumferential fin 30a can be prevented.

The fin in the electrically floating state is not limited to be configured using one fin positioned at the outermost circumference of the fin arrangement region 10 and may be configured using two or more adjacent fins that may have a shape different from the shape of the fin of the center portion of the fin arrangement region 10 and are positioned at the outermost circumference of the fin arrangement region 10, in detail, two or more fins that are formed from the outermost circumference of the fin arrangement region 10 to the inner side.

The P-type well region 20 is formed on the outermost circumference of the semiconductor substrate 70. In this way, since the current certainly is not flown by the outermost circumferential fin 30a having the P-type impurity diffusion region, the deterioration of a characteristic of the SCR-type ESD protection element 1 due to the variation in the shape of the outermost circumferential fin 30a can be suppressed. In addition, when a normal bulk substrate is used as the semiconductor substrate 70, a conductive type of plural bulk substrates is a P type. For this reason, the P-type well region 20 can be easily disposed on an outer circumferential portion of the semiconductor substrate 70 and a wide area is not needed when the P-type well region is formed on the outer circumferential portion.

By using the fin positioned at one inner side with respect to the outermost circumference fin 30a as the well contact region 43, the deterioration of a characteristic of the SCR-type ESD protection element 1 due to the variation in the shape of the outermost circumferential fin 30a can be prevented.

In the FinFET according to this embodiment, a left end in FIG. 3 is not terminated as illustrated in the drawing, and repetitive structures of the N-type well region 20/the P-type well region 21 of the desired number are arranged on the semiconductor substrate 70. Also, a dimension of a longitudinal direction in FIG. 3 is not limited to the dimension illustrated in the drawing and repetitive structures of the desired number may be disposed.

The length of each fin in the longitudinal direction of FIG. 3 (length of the long side) may be increased. However, the length of an elongated mask material that is used to form each fin is preferably set to the length that does not cause pattern collapse in a manufacturing process such as a wafer drying process after a wet cleaning process.

As illustrated in FIG. 3, the contact region 51 with respect to each fin is disposed in a checker shape. This is to improve lithography precision of when the contact regions 51 are formed, by increasing the distance between the contact regions 51 to be adjacent to each other and easily performing lithography.

According to this embodiment, the SCR-type ESD protection element 1 that can flow a sufficient current needed to protect the element is formed using the fins having the same width and the same interval as those of the fins used in the FinFET. Therefore, the fins having the same width and the same interval can be formed with uniform over the entire semiconductor substrate 70. For example, when the thin fin and the thick fin are mixed and formed on the semiconductor substrate 70, because uniformity of the surface pattern density is collapsed, the collapse of the uniformity may cause overetching called as dishing in chemical mechanical polishing (CMP) used for planarization. However, in this embodiment, since the fins having the same width and the same interval are formed over the entire semiconductor substrate 70, the above problem can be avoided and the uniform fins can be formed with high precision.

In this embodiment, the outermost circumferential fin 30a is set to the electrically floating state and is not used as the portion forming the SCR-type ESD protection element 1, that is, the outermost circumferential fin 30a that may have the shape different from the shape of the fin of the center portion of the fin arrangement region 10a by a micro-loading effect is not used. Therefore, the deterioration of the electrical characteristic or the variation of the characteristic in the SCR-type ESD protection element 1 can be prevented.

The micro-loading effect is explained as follows. In formation of the bulk FinFET, the plural fins are formed with uniform by processing the bulk silicon substrate using reactive ion etching (RIE). When the plural fins are formed, because symmetry of etching rate is collapsed in the fin positioned at the outer circumferential portion of the fin arrangement region 10, as compared with other fins, the width of the fin may change or the cross-section of the fin may become a bottom-expanded inclined shape. This phenomenon is called a micro-loading effect of the RIE. The inventor guesses that the phenomenon is generated because the volume of cut area of the substrate in in the center portion and the volume of cut area of substrate in the outer circumferential portion of the fin arrangement region 10 become different and a balance of etching of the RIE and deposition is collapsed in the outer circumferential portion of the fin arrangement region 10.

As such, when the width of the fin increases or the cross-section of the fin becomes the bottom-expanded inclined shape, this affects formation of a punch through prevention layer performed after the fin is formed. If the punch through prevention layer is not provided, this weakens resistance with respect to the punch through between the source/drain, in an operation as the Fin FET.

In the outer circumferential portion of the fin arrangement region 10, another problem is generated. For example, when a burying material buried in a device isolation region between the fins is etched, the difference is generated in an etching rate due to the micro-loading effect and the etched depth of the burying material in the outer circumferential portion of the fin arrangement region 10 becomes different from the etched depth of the burying material of the center portion of the fin arrangement region 10. Alternately, the polishing depth of the burying material by the CMP in the outer circumferential portion of the fin arrangement region 10 becomes different from the polishing depth of the burying material of the center portion of the fin arrangement region 10. As a result, the position of the punch through prevention layer that is formed after formation of the device isolation region may become different in the fin of the center portion of the fin arrangement region 10 and the fin of the outer circumferential portion of the fin arrangement region 10 and the p-n junction position (height) or an impurity profile of the p-n junction may become different. Therefore, in this state, when the fins are used as the SCR-type ESD protection element 1, it is anticipated that a current characteristic becomes different due to the difference of the places in the wafer. The current may be concentrated on a portion where the current easily flows and the p-n junction may be broken down or the fins may be melted by the Joule heating generated by the concentrated current.

However, in this embodiment, the outermost circumferential fin 30a is set to the electrically floating state and is not used as the portion forming the SCR-type ESD protection element 1. Therefore, the deterioration of the characteristic of the SCR-type ESD protection element 1 that is generated due to the deterioration of the punch through resistance, the destruction of the fins, and the shape difference of the outermost circumferential fin 30a and the other fins can be prevented.

In this embodiment, the P-type conductive type and the N-type conductive type may be switched.

Second Embodiment

In the first embodiment, one fin is used as each of the anode region, the cathode region, and the trigger region of the SCR-type ESD protection element. However, in this embodiment, one group of plural fins are used as each of the anode region, the cathode region, and the trigger region of the SCR-type ESD protection element, which is different from the first embodiment. Since the resistance of the anode region, the cathode region, and the trigger region configured using the plural fins decreases, resistance of the SCR-type ESD protection element with respect to the current can be improved by connecting each of the anode region, the cathode region, and the trigger region to the thick wiring lines through the plural contact regions. Since the plural adjacent fins forming one group are formed to have the same conductive diffusion layer, mask precision that is required when ions are implanted to form the diffusion layer is moderated as compared with the first embodiment. Therefore, the SCR-type ESD protection element can be formed with a low cost while the variation of the characteristic of the SCR-type ESD protection element is suppressed.

Figure 5:
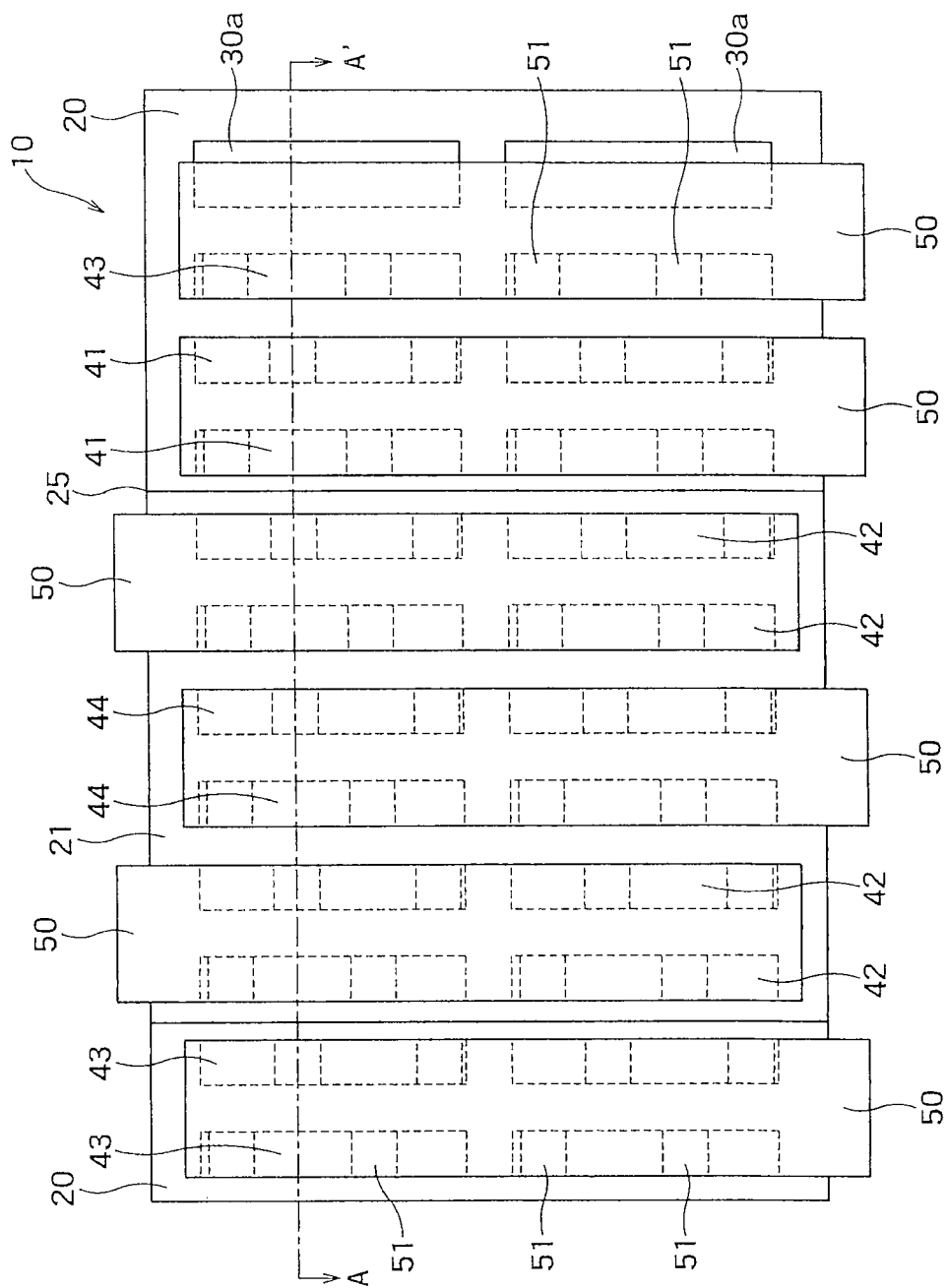
FIG. 5 is a plan view of a semiconductor device according to a second embodiment.
Figure 6:
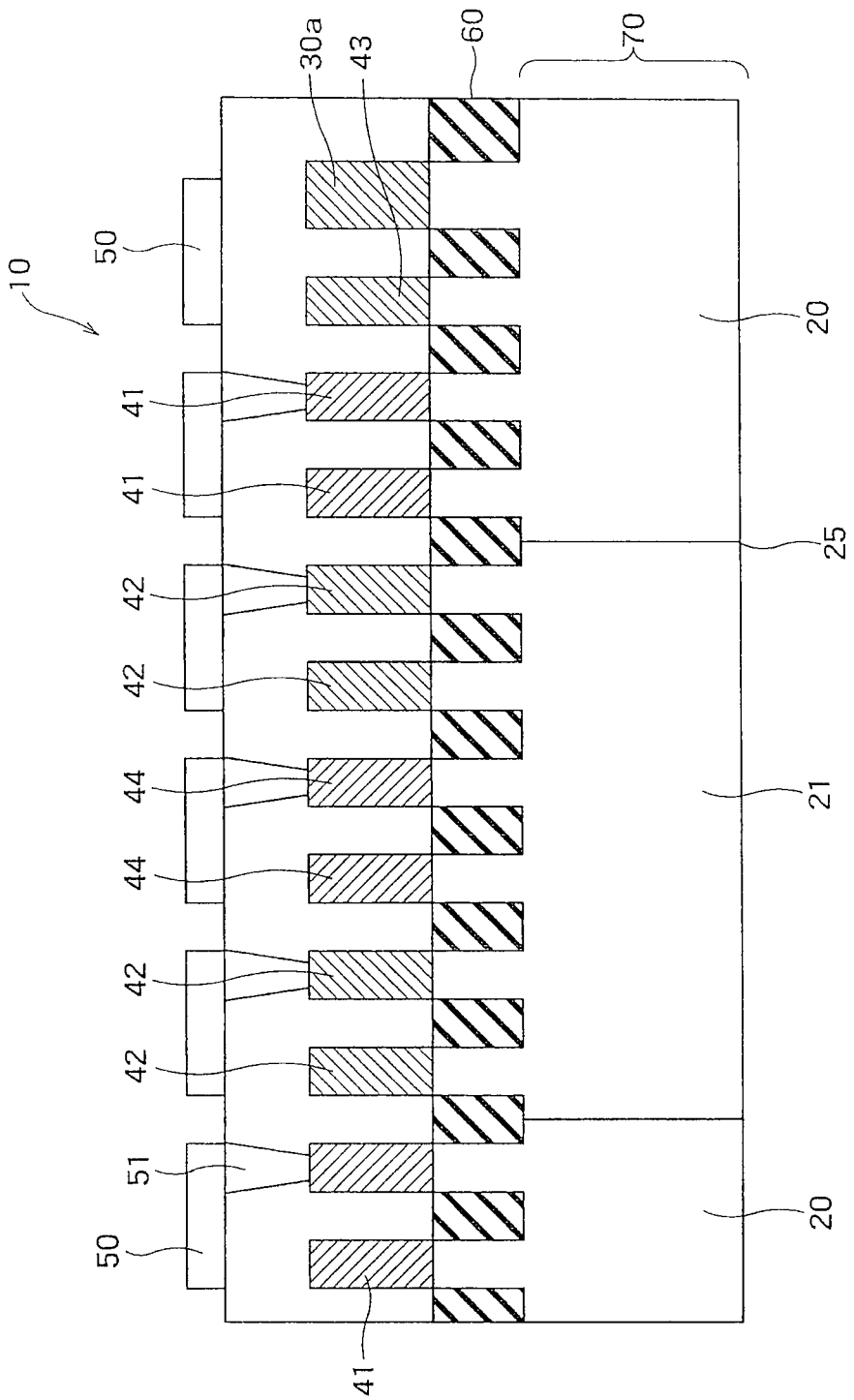
FIG. 6 is a cross-sectional view of the semiconductor device according to the second embodiment.

FIG. 5 illustrates a plan view of the FinFET according to this embodiment and FIG. 6 illustrates a cross-sectional view taken along the line A-A' of FIG. 5. In FIG. 5, each fin and each contact region 51 that exist below wiring lines 50 are illustrated by a dotted line. In this case, portions that are common to those of the first embodiment are not described.

As illustrated in FIGS. 5 and 6, similar to the first embodiment, the SCR-type ESD protection element 1 has a P-type well region 20 that is positioned at the outermost circumference of the semiconductor substrate 70 and an N-type well region 21 that is positioned to be adjacent to the P-type well region 20. Each of the well regions 20 and 21 has plural fins that are arranged in a stripe shape with a desired width and a desired interval over the entire well region.

A group of cathode regions 41 that includes two fins having an N-type impurity diffusion layer region are positioned in the P-type well region 20 and a group of anode regions 42 that includes two fins having a P-type impurity diffusion layer region are positioned in the N-type well region 21, such that the well region boundary 25 that is the boundary of the P-type well region 20 and the N-type well region 21 is interposed between the group of cathode regions 41 and the group of anode regions 42. A well contact region 43 that includes a fin having a P-type impurity diffusion layer region is positioned in the P-type well region 20 and a group of trigger regions 44 that includes two fins having an N-type impurity diffusion layer region is positioned in the N-type well region 21, such that the group of cathode regions 41 and the group of anode regions 42 are interposed between the well contact region 43 and the group of trigger regions 44. The group of trigger regions 44 is adjacent to the group of anode regions 42 that includes the two fins having the P-type impurity diffusion layer region. That is, the trigger region 44 is interposed between the two groups of anode regions 42.

The group of cathode regions 41, the two groups of anode regions 42, the well contact region 43, and the group of trigger regions 44 are connected to the wiring lines 50 through the contact regions 51. Similar to the first embodiment, the contact region 51 with respect to each fin is disposed in a checker shape. The wiring lines 50 are arranged at the same pitch and the pitch becomes more than the pitch between the fins.

In this embodiment, similar to the first embodiment, the outermost circumferential fin 30a is formed to have the P-type impurity diffusion layer region, the contact region 51 that corresponds to the outermost circumferential fin 30a is not formed, the outermost circumferential fin 30a is in an electrically floating state, and the outermost circumferential fin 30a is not used as a portion forming the SCR-type ESD protection element 1. Similar to the first embodiment, by forming the P-type well region 20 on the outermost circumference of the semiconductor substrate 70 and using the fin positioned at one inner side with respect to the outermost circumference fin 30a as the well contact region 43, the deterioration of a characteristic of the SCR-type ESD protection element 1 due to the shape difference of the outermost circumferential fin 30a and the other fins can be prevented.

In addition, as can be seen from FIG. 5, the wiring line 50 is formed to overlap a part of the outermost circumferential fin 30a from a viewpoint of the plane layout. In this way, the interval of the wiring lines 50 can be equalized over the entire semiconductor substrate 70 and the wiring lines 50 can be formed with higher precision.

Figure 7:
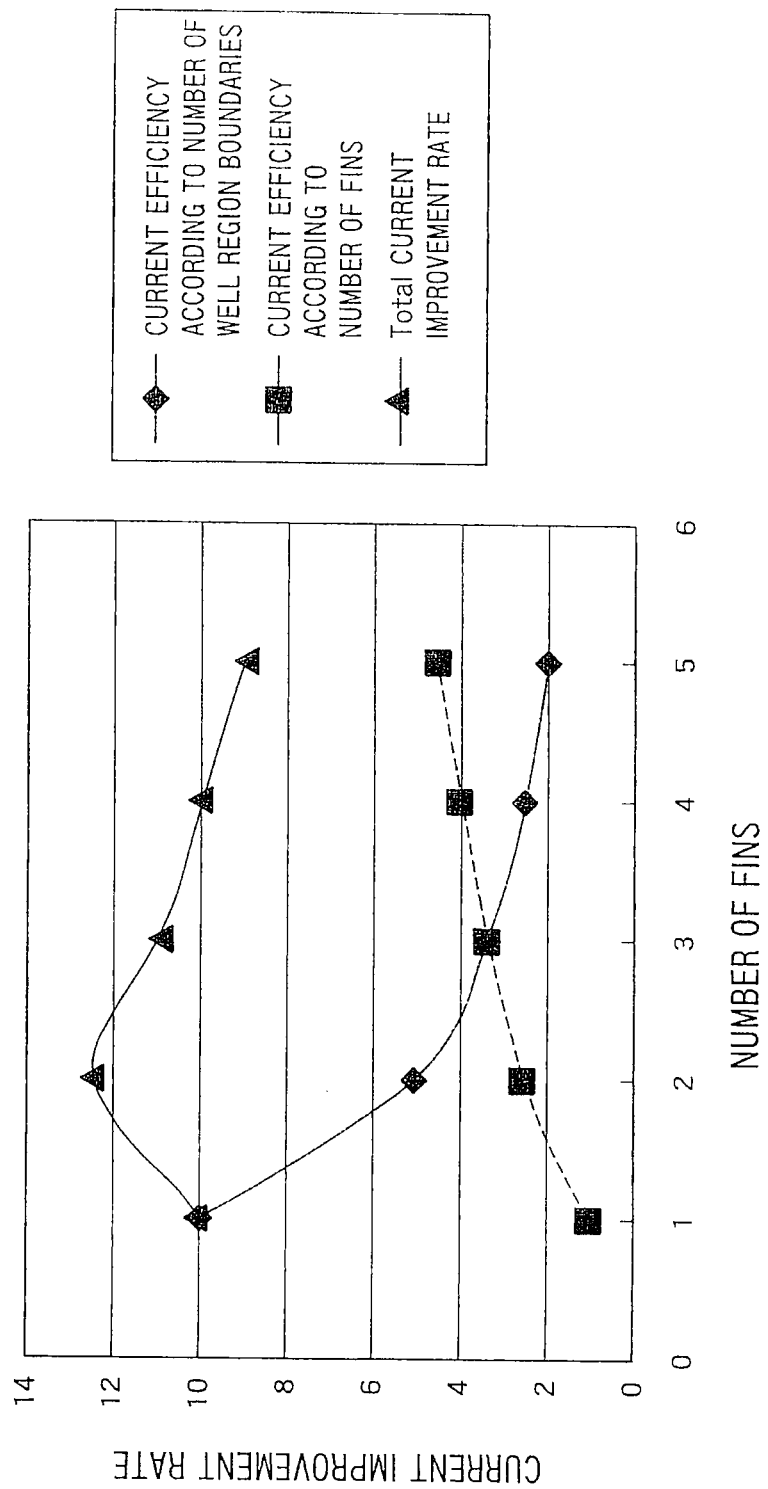
FIG. 7 is a diagram illustrating the number of fins according to the second embodiment.

In this embodiment, the number of fins that constitute each of the group of cathode regions 41, the group of anode regions 42, and the group of trigger regions 43 of the SCR-type ESD protection element 1 illustrated in FIGS. 5 and 6 is not limited to two and may be two or more. As such, when the number of fins in an electrode region increases, resistance values of the cathode region 41, the anode region 42, and the trigger region 43 can be decreased. Therefore, it can be expected that current efficiency of the SCR-type ESD protection element 1 for each unit well boundary length is improved. Since the anode region 42 is interposed and the distance of the cathode region 41 and the trigger region 44 increases, it is anticipated that base resistance of the bipolar transistor that functions as the SCR-type ESD protection element 1 increases and current efficiency is deteriorated. For this reason, it is considered that the current improvement rate obtained by increasing the number of fins in one electrode region is not linearly proportional to the number of configured fins and becomes a curved line having a convex shape in an upward direction, as illustrated in FIG. 7.

From a viewpoint of a footprint (occupied area) of the SCR-type ESD protection element 1, if the number of fins in each electrode region increases, an area of each of the N-type well region 20 and the P-type well region 21 increases and the number of times of repeating the well region pattern decreases. For this reason, the length of the boundary of the N-type well region and the P-type well region in a constant device area, that is, a facing area of the anode region 42 and the cathode region 41 determined by the length of the well region boundary 25 may decrease. It is considered that the facing area is proportional to "1/(the number of fins)". It is considered that the turn-on current decreases, because the turn-on current of the SCR-type ESD protection element 1 depends on the facing area.

Therefore, in consideration of the above, if the number of fins forming each of a group of cathode regions 41, a group of anode regions 42, and a group of trigger regions 43 of the SCR-type ESD protection element 1 increases, gain (current efficiency) of the bipolar transistor of the SCR-type ESD protection element 1 for each unit well boundary length is improved. However, if the number of fins excessively increases, because the well boundary length decreases, comprehensive performance of the SCR-type ESD protection element 1 is lowered and it is concerned that the current driving force is degraded. Since the thickness of the wiring line 50 needs to be balanced with the thickness of the other wiring lines 50, it is impossible to immoderately increase the thickness of the wiring line 50 to take the contacts in all regions, even though the number of fins increases. Therefore, an optimal value is set to the number of fins and the SCR-type ESD protection element 1 is preferably designed in consideration of the number of fins.

According to this embodiment, since the SCR-type ESD protection element 1 is formed using the fins having the same width and the same interval as the fins used in the FinFET, the uniform fins can be formed with high precision. Since the outermost circumferential fin 30a is set to the electrically floating state and is not used as the portion forming the SCR-type ESD protection element 1, the deterioration in the characteristic of the SCR-type ESD protection element 1 can be prevented.

According to this embodiment, since each of the anode region, the cathode region, and the trigger region of the SCR-type EDS protection element 1 is formed using the plural fins and is connected by the thick wiring line 50, melting or destruction of the fins can be prevented and the parasitic resistance can be prevented from increasing.

In the first embodiment described above, the N-type ions and the P-type ions are implanted into the adjacent fins disposed at the narrow interval and the impurity diffusion layer regions are formed. Meanwhile, in this embodiment, since the same conductive ions are implanted into the adjacent fins forming one group, the difficulty in the process technology due to mismatching of the masks used in the ion implantation and a decrease in the effective opening width of the masks caused by the mismatching is alleviated as compared with the first embodiment, the ions can be implanted with high precision. Therefore, the variation in the device characteristics and deterioration in the breakdown voltage of the SCR-type ESD protection element 1 can be prevented.

Similar to the first embodiment, in the FinFET according to this embodiment, a left end in FIG. 5 is not terminated as illustrated in the drawing and repetitive structures of the N-type well region 20/the P-type well region 21 are arranged by the desired number. Also, a dimension of a longitudinal direction in FIG. 5 is not limited to the dimension illustrated in the drawing and repetitive structures may be arranged by the desired number.

Third Embodiment

In the third embodiment, the fins of the fin arrangement region 10 are formed using a sidewall image transfer technique. The sidewall image transfer technique disposes a dummy pattern on a substrate, deposits a spacer material film such as an insulating film to cover a side of the dummy pattern to form a sidewall spacer, removes the dummy pattern, and forms the fins using a pattern by the sidewall spacer of a rectangular ring shape. According to the sidewall image transfer technique, since the width of the sidewall spacer depends on the thickness of the spacer material film deposited on the sidewall of the dummy pattern, the sidewall spacer that has the uniform width can be formed. Therefore, according to this embodiment, the fins can be formed with dimension precision higher than that of the photolithography.

Figure 8:
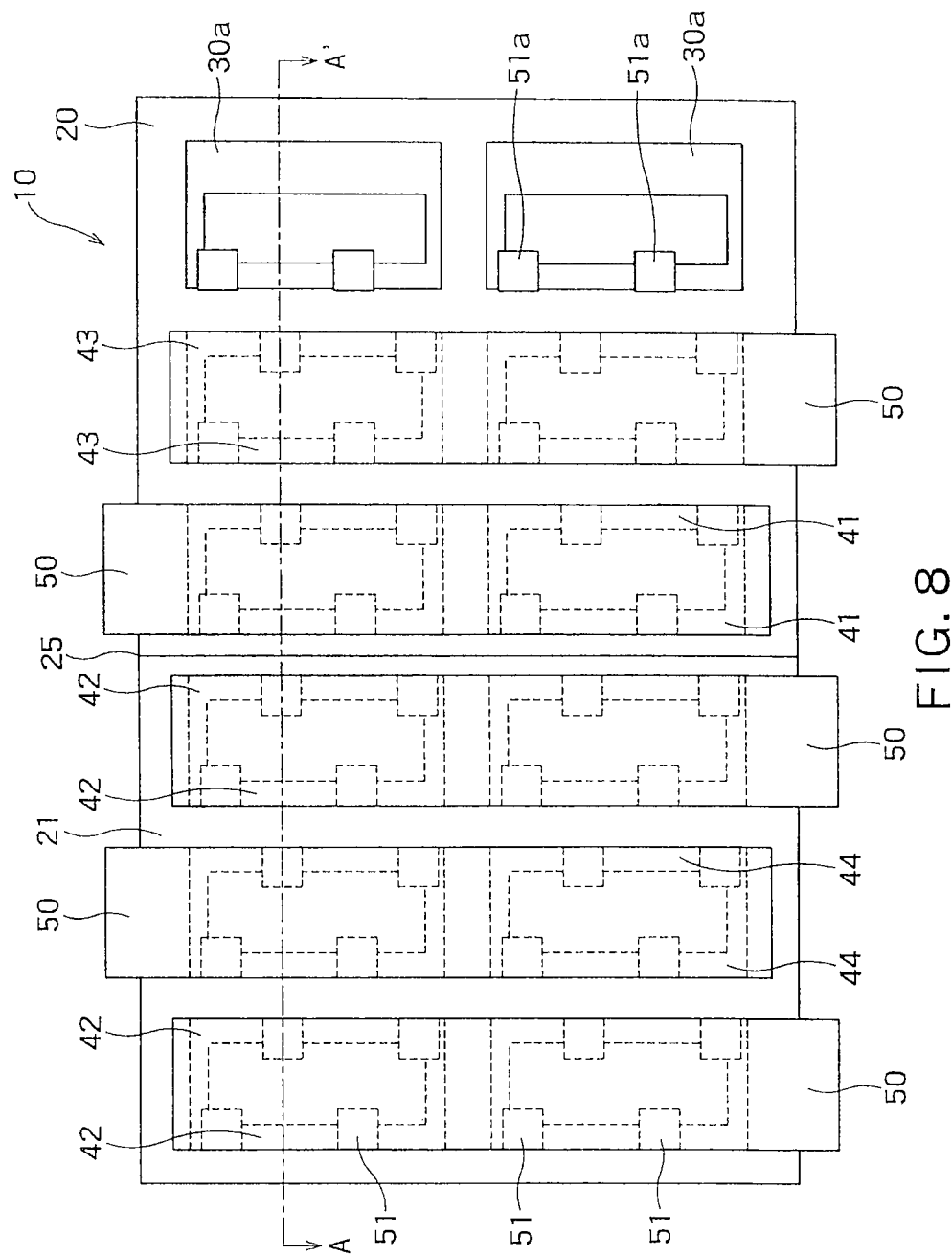
FIG. 8 is a plan view of a semiconductor device according to a third embodiment.
Figure 9:
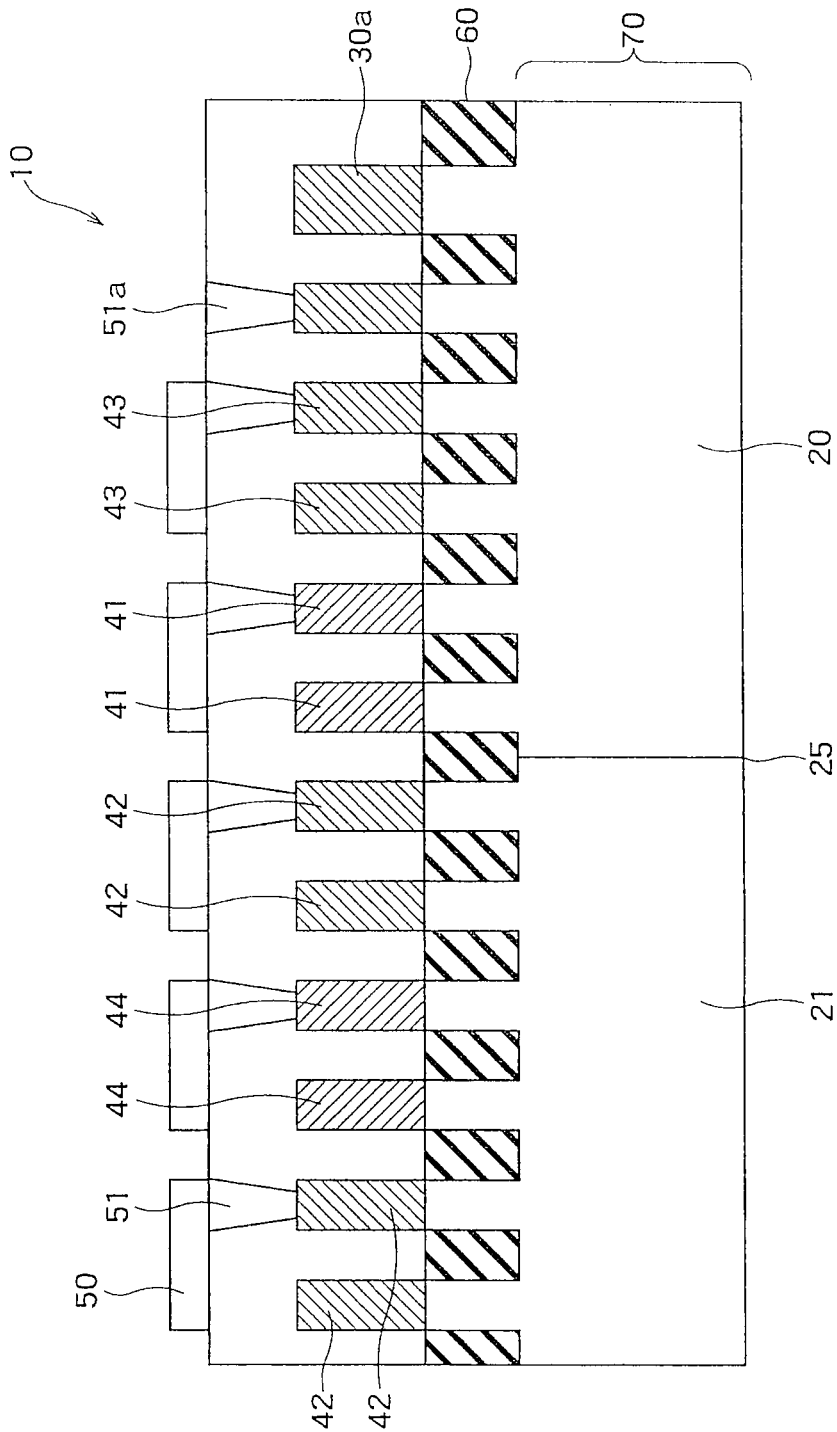
FIG. 9 is a cross-sectional view of the semiconductor device according to the third embodiment.

FIG. 8 illustrates a plan view of the FinFET according to this embodiment and FIG. 9 illustrates a cross-sectional view taken along the line A-A' of FIG. 8. In FIG. 8, each fin and each contact region that exist below wiring lines are illustrated with a dotted line. In this case, the description of the same portions of the first and second embodiments will not be repeated.

As illustrated in FIGS. 8 and 9, similarly to the first and second embodiments, the SCR-type ESD protection element 1 has a P-type well region 20 that is positioned at the outermost circumference of the semiconductor substrate 70 and an N-type well region 21 that is positioned to be adjacent to the P-type well region 20. Each of the well regions 20 and 21 has plural fins that are arranged in a matrix and have a rectangular ring shape.

A cathode region 41 that is a fin of a ring shape having an N-type impurity diffusion layer region is positioned in the P-type well region 20 and an anode region 42 that is a fin of a ring shape having a P-type impurity diffusion layer region is positioned in the N-type well region 21, so that the well region boundary 25 to be the boundary of the P-type well region 20 and the N-type well region 21 is interposed between the cathode region 41 and the anode region 42. A well contact region 43 that is a fin of a ring shape having a P-type impurity diffusion layer region is positioned in the P-type well region 20 and a trigger region 44 that is a fin of a ring shape having an N-type impurity diffusion layer region is positioned in the N-type well region 21, so that the cathode region 41 and the anode region 42 are interposed between the well contact region 43 and the trigger region 44. The trigger region 44 is adjacent to the anode region 42 that is the fin of the ring shape having the P-type impurity diffusion layer region. That is, the trigger region 44 is interposed between the two anode regions 42.

Each of the cathode region 41, the anode region 42, the well contact region 43, and the trigger region 44 is configured using the pattern having the rectangular ring shape as described above, and the impurity diffusion layer region of each of the regions is formed at the inner side of the pattern having the rectangular ring shape.

The cathode region 41, the anode region 42, the well contact region 43, and the trigger region 44 are connected to the wiring lines 50 through the contact regions 51.

Similarly to the first and second embodiments, in this embodiment, the outermost circumferential fin 30a is formed to have the P-type impurity diffusion layer region, is set to be in the electrically floating state, and is not used as a portion forming the SCR-type ESD protection element 1. The dimension precision of the sidewall dummy pattern of the outermost circumference is low. Therefore, the outermost circumferential fin 30a may have a shape different from the shapes of the other fins. However, in this way, the deterioration of the electrical characteristic or the variation of the characteristic in the SCR-type ESD protection element 1 can be prevented. Similarly to the first and second embodiments, by forming the P-type well region 20 on the outermost circumference of the semiconductor substrate 70 and using the fin positioned at one inner side with respect to the outermost circumference fin 30a as the well contact region 43, the deterioration of the electrical characteristic or the variation of the characteristic in the SCR-type ESD protection element 1 due to the shape difference between the outermost circumferential fin 30a and the other fins can be prevented.

In this embodiment, a dummy contact region 51a is formed on the outermost circumferential fin 30a. This is to maintain symmetry of the pattern of the contact region 51 to improve precision of lithography to form the contact region 51.

As illustrated in FIGS. 8 and 9, the fin in the electrically floating state is not limited to the configuration using one fin having the ring shape positioned at the outermost circumference of the fin arrangement region 10 and may be configured using plural fins having a shape different from that of the fin at the center portion of the fin arrangement region 10 and positioned at the outermost circumference of the fin arrangement region 10, in detail, plural fins formed from the outermost circumference of the fin arrangement region 10 to the inner side. However, each of the cathode region 41, the anode region 42, the well contact region 43, and the trigger region 44 is preferably formed to have an even number of the impurity diffusion layer regions. In this way, it is not needed to separate the impurity diffusion regions existing in the same fin. Since the same conductive ions are implanted into the impurity diffusion layer regions formed in the same fin, the difficulty in the process technology due to mismatching of the masks used in the ion implantation and a decrease in the effective opening width of the masks caused by the mismatching is alleviated as compared with the first embodiment, the ions can be implanted with high precision. Therefore, the variation in the device characteristics and the deterioration in the breakdown voltage of the SCR-type ESD protection element 1 can be prevented.

According to this embodiment, since the SCR-type ESD protection element 1 is formed using the fins having the same width and the same interval as the fins used in the FinFET, the uniform fins can be formed with high precision. Since the fins are formed using the sidewall image transfer technique, the fins can be obtained with higher dimension precision. Since the outermost circumferential fin 30a is set to be in the electrically floating state and is not used as the portion forming the SCR-type ESD protection element 1, the deterioration of the electrical characteristic in the SCR-type ESD protection element 1 can be prevented.

Similarly to the first and second embodiments, in the FinFET according to this embodiment, a left end in FIG. 8 is not terminated as illustrated in the drawing and repetitive structures of the N-type well region 20/the P-type well region 21 are arranged by the desired number. Also, a dimension of a longitudinal direction in FIG. 8 is not limited to the dimension illustrated in the drawing and repetitive structures may be arranged by the desired number.

The shape of each fin is not limited to the shape illustrated in FIG. 8. However, each fin preferably has a shape and a size in which the sidewall dummy pattern to form the fins is not fallen.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device that has a rectification element, comprising:
   a semiconductor substrate;
   a first well region of a first conductivity type formed on the semiconductor substrate;
   a second well region of a second conductivity type formed on the semiconductor substrate; and
   a plurality of fins arranged over the first well region and the second well region at a first pitch in the same direction,
   wherein the first well region and the second well region are arranged to come in contact with each other in a direction along a short side of the fin to form a well region boundary parallel to a long side of the fin,
   a first pair of the fins are positioned so as to interpose the well region boundary therebetween, one fin of the first pair being a cathode region with a second conductivity type impurity diffusion layer region positioned in the first well region, and another fin of the first pair being an anode region with a first conductivity type impurity diffusion layer region positioned in the second well region,
   a second pair of the fins are positioned so as to interpose the first pair therebetween, one fin of the second pair being a well contact region with a first conductivity type impurity diffusion layer region positioned in the first well region, and another fin of the second pair being a trigger region with a second conductivity type impurity diffusion layer region positioned in the second well region,
   the rectification element includes the cathode region, the anode region, the well contact region, and the trigger region,
   each of the cathode region, the anode region, the well contact region, and the trigger region is connected to each wiring portion to form a PNP-type bipolar transistor and an NPN-type bipolar transistor, and
   the first well region is positioned at the outermost circumference of the semiconductor substrate, and the semiconductor device further includes an outermost circumferential fin positioned to be closer to the outer circumference from the well contact region, the outermost circumferential fin having a first conductivity type impurity diffusion layer region, and being in an electrically floating state.

2. The semiconductor device of claim 1,
   wherein the outermost circumferential fin has a shape that is different from a shape of the fins.

3. The semiconductor device of claim 1, further comprising:
   at least two outermost circumferential fins that are adjacent to each other in a direction along the short side of the fin.

4. The semiconductor device of claim 1,
   wherein each of the cathode region, the anode region, the well contact region, and the trigger region is connected to each wiring portion by a contact region, and
   the contacts are arranged in a checker shape.

5. The semiconductor device of claim 1,
   wherein the wiring portions are arranged at a second pitch in a direction along the short side of the fin.

6. The semiconductor device of claim 1,
   wherein each of the well contact region, the cathode region, the anode region, and the trigger region is configured using at least two fins to be adjacent to each other in a direction along the short side of the fin.

7. The semiconductor device of claim 6,
   wherein each of the cathode region, the anode region, the well contact region, and the trigger region is connected to each wiring portion by a contact region, and
   the contacts are arranged in a checker shape.

8. The semiconductor device of claim 6,
   wherein the wiring portions are arranged at a second pitch in a direction along the short side of the fin.

9. The semiconductor device of claim 8,
   wherein the second pitch is larger than the first pitch.

10. The semiconductor device of claim 1,
    wherein the fins have rectangular ring shapes.

11. The semiconductor device of claim 10,
    wherein the first well region is positioned at the outermost circumference of the semiconductor substrate, and
    the semiconductor device further includes an outermost circumferential fin positioned to be closer to the outer circumference from the well contact region, the outermost circumferential fin having a rectangular ring shape and a first conductivity type impurity diffusion layer region, and being in an electrically floating state.

12. A semiconductor device that has a rectification element, comprising:
    a semiconductor substrate;
    a first well region of a first conductivity type formed on the semiconductor substrate;
    a second well region of a second conductivity type formed on the semiconductor substrate; and
    a plurality of fins that have rectangular ring shapes and are arranged over the first well region and the second well region at a first pitch in the same direction,
    wherein the first well region and the second well region are arranged to be in contact with each other in a direction along a short side of the fin to form a well region boundary parallel to a long side of the fin,
    a first pair of the fins are positioned so as to interpose the well region boundary therebetween, one fin of the first pair being a cathode region with second conductivity type impurity diffusion layer region positioned in the first well region, and another fin of the first pair being an anode region with a first conductivity type impurity diffusion layer region positioned in the second well region,
    a second pair of the fins are positioned so as to interpose the first pair therebetween, one fin of the second pair being a well contact region with a first conductivity type impurity diffusion layer region positioned in the first well region, and another fin of the second pair being a trigger region with a second conductivity type impurity diffusion layer region positioned in the second well region,
    the rectification element includes the cathode region, the anode region, the well contact region, and the trigger region, and
    each of the cathode region, the anode region, the well contact region, and the trigger region is connected to each wiring portion to form a PNP-type bipolar transistor and an NPN-type bipolar transistor.

13. The semiconductor device of claim 12,
    wherein the first well region is positioned at the outermost circumference of the semiconductor substrate, and
    the semiconductor device further includes an outermost circumferential fin positioned to be closer to the outer circumference from the well contact region, the outermost circumferential fin having a rectangular ring shape and a first conductivity type impurity diffusion layer region, and being in an electrically floating state.

14. The semiconductor device of claim 12,
wherein each of the cathode region, the anode region, the well contact region, and the trigger region is connected to each wiring portion by a contact region, and
the contacts are arranged in a checker shape.

15. The semiconductor device of claim 13,
wherein the outermost circumferential fin has a shape that is different from a shape of the fins.

16. The semiconductor device of claim 13,
wherein the outermost circumferential fin includes a dummy contact region.

17. A semiconductor device that has a rectification element, comprising:
a semiconductor substrate;
a first well region of a first conductivity type formed on the semiconductor substrate;
a second well region of a second conductivity type formed on the semiconductor substrate; and
a plurality of fins arranged over the first well region and the second well region at a first pitch in the same direction,
wherein the first well region and the second well region are arranged to come in contact with each other in a direction along a short side of the fin to form a well region boundary parallel to a long side of the fin,
a first pair of the fins are positioned so as to interpose the well region boundary therebetween, one fin of the first pair being a cathode region with a second conductivity type impurity diffusion layer region positioned in the first well region, and another fin of the first pair being an anode region with a first conductivity type impurity diffusion layer region positioned in the second well region,
a second pair of the fins are positioned so as to interpose the first pair therebetween, one fin of the second pair being a well contact region with a first conductivity type impurity diffusion layer region positioned in the first well region, and another fin of the second pair being a trigger region with a second conductivity type impurity diffusion layer region positioned in the second well region,
the rectification element includes the cathode region, the anode region, the well contact region, and the trigger region,
each of the cathode region, the anode region, the well contact region, and the trigger region is connected to each wiring portion to form a PNP-type bipolar transistor and an NPN-type bipolar transistor, and
the wiring portions are arranged at a second pitch in a direction along the short side of the fin.

18. The semiconductor device of claim 17,
wherein the first well region is positioned at the outermost circumference of the semiconductor substrate, and
the semiconductor device further includes an outermost circumferential fin positioned to be closer to the outer circumference from the well contact region, the outermost circumferential fin having a first conductivity type impurity diffusion layer region, and being in an electrically floating state.

19. The semiconductor device of claim 18,
wherein the outermost circumferential fin has a shape that is different from a shape of the fins.

20. The semiconductor device of claim 18,
wherein a portion of the outermost circumferential fin is covered by the wiring portion.

\* \* \* \* \*

UNITED STATES PATENT AND TRADEMARK OFFICE
CERTIFICATE OF CORRECTION

PATENT NO. : 8,569,867 B2
APPLICATION NO. : 13/364716
DATED : October 29, 2013
INVENTOR(S) : Satoshi Inaba It is certified that error appears in the above-identified patent and that said Letters Patent is hereby corrected as shown below:

In the Claims

Column 11, line 58, (Claim 4, line 4), delete "region".
Column 12, line 4, (Claim 7, line 4), delete "region".

Signed and Sealed this
Twenty-fourth Day of June, 2014

Michelle K. Lee
*Deputy Director of the United States Patent and Trademark Office*